United States Patent
Wolf

(10) Patent No.: US 7,572,754 B2
(45) Date of Patent: Aug. 11, 2009

(54) HIGH TEMPERATURE SUPERCONDUCTOR MATERIAL OF BSCCO SYSTEM AND STARTING COMPOSITION THEREFORE

(75) Inventor: Andre Wolf, Frantz-Peter-Kurten-Weg (DE)

(73) Assignee: Nexans (FR)

( * ) Notice: Subject to any disclaimer, the term of this patent is extended or adjusted under 35 U.S.C. 154(b) by 380 days.

(21) Appl. No.: 11/251,105

(22) Filed: Oct. 14, 2005

(65) Prior Publication Data

US 2006/0122068 A1 Jun. 8, 2006

(30) Foreign Application Priority Data

Oct. 19, 2004 (EP) .................. 04300692

(51) Int. Cl.
*H01B 12/00* (2006.01)
*C04B 111/90* (2006.01)

(52) U.S. Cl. ...................... 505/121; 505/782
(58) Field of Classification Search ............. 505/121, 505/782
See application file for complete search history.

(56) References Cited

U.S. PATENT DOCUMENTS

| | | | | |
|---|---|---|---|---|
| 5,478,801 A | * | 12/1995 | Lang et al. | 358/1.15 |
| 5,883,052 A | * | 3/1999 | Yurek et al. | 505/430 |
| 6,784,138 B2 | * | 8/2004 | Tallon | 505/120 |

FOREIGN PATENT DOCUMENTS

| | | |
|---|---|---|
| DE | 3830092 | 3/1990 |
| DE | 4019368 | 12/1991 |
| EP | 0327044 | 8/1989 |
| EP | 0330305 | 8/1989 |
| EP | 0573798 | 12/1993 |
| EP | 1650178 | * 4/2006 |
| WO | WO 97/49118 | * 12/1997 |
| WO | 0008657 | 2/2000 |

OTHER PUBLICATIONS

Nagai et al "Effect of Barium addition on the formation of High-Tc Phase in the Bi-Sr-Ca-Cu-O system", Journal of the Japan Society of Powder and Powder Metallurgy, vol. 37, No. 1, pp. 69-72, Jan. 1990 (Abstract Only).*
Hakuraku et al "Effect of Ba-doping on the superconductivity of Bi(Pb)-Sr-Ca-Cu-O", Japan Journal of Applied Physics, 39(5), L749-752, May 1990.*
Yang et al "Superconductivity of Barium-Doped Bi2Sr2CaCu2Oy", Journal of Superconductivity, 9(2), 1996, 161-165.*
Elschner et al "High Currents in MCP BSCCO 2212 Bulk Material", IEEE Trans on Magnetics, vol. 32, No. 4, 1996, 2724-27.*
Bock et al "Large Shaped Parts of MElt Cast BSCCO . . . , ", IEEE Trans on Superconductivity, vol. 3, No. 1, 1993, 1659-62.*
The influence of BaO2 additions on micro-structure and superconducting properties of Bi2Sr2CaCu2O8+g- dated May 4, 2001 (abstract).
Effect of Ba Addition on the Properties of Bi-Pb-Sr-Ca-Cu-O Superconductors dated Oct. 28, 1988 (abstract).

* cited by examiner

*Primary Examiner*—Mark Kopec
(74) *Attorney, Agent, or Firm*—Sofer & Haroun, LLP

(57) ABSTRACT

A high temperature superconductor material of BSCCO-family is provided wherein parts of Sr of the superconducting phases is substituted by Ba.

8 Claims, No Drawings

HIGH TEMPERATURE SUPERCONDUCTOR MATERIAL OF BSCCO SYSTEM AND STARTING COMPOSITION THEREFORE

RELATED APPLICATION

This application is related to and claims the benefit of priority to European Patent Application No. 04 300 692.3, filed on Oct. 19, 2004, the entirety of which is incorporated herein by reference.

FIELD OF THE INVENTION

The present invention relates to improved melt cast high temperature superconductors of the Bismuth-Strontium-Calcium-Copper-Oxide system, a starting composition therefore and the use thereof in centrifugal melt casting techniques.

BACKGROUND OF THE INVENTION

Within this type of superconductors there exist several superconducting phases which differ in their number of copper-oxide layers in the crystalline unit cell. The composition of the superconducting phases of this system is generally described by the ideal formula $Bi_2Sr_2Ca_{n-1}Cu_nO_y$ where n represents the number of copper-oxide layers. For technical application the most interesting phases are those with n=2 and n=3, respectively, referred to BSCCO-2212 (also referred to "Bi-2221") with an approximate transition temperature of 85 K and BSCCO-2223 (also referred to "Bi-2223") with an approximate transition temperature of 110 K.

The unit cells of these phases have a layer structure consisting of BiO double layers that alternate with perovskite-like $Sr_2Ca_{n-1}Cu_nO_{1-2n}$ units having also a layered structure with copper oxide sheets. As set out above, the Bi-2212 and Bi-2223 phases are characterized by 2 and 3 copper oxide sheets, respectively.

Generally, it is known, that some of the metal elements of these phases can be substituted, at least partially, by one or more other individual elements. For example, it is well known to substitute Bi partially by Pb. In particular, the Pb substitution of Bi leads to improved properties in case of the 2223 phase. Furthermore, calcium and strontium can substitute by each other.

In general, the high temperature superconductors of the BSCCO-family and methods for their production are well known in the art and numerous papers have been published regarding the discovery of these superconductors and the development of new methods including suitable starting compositions and heat treatments. For example, a summery of suitable methods is given in Superconductor, Science and Technology, Volume 6, number 1, January 1993 "Synthesis of cuprate superconductors", pages 1 to 22 and in WO 00/08657 to which reference is explicitly made.

For example, in the so called ceramic route powdery mixtures of weight amounts of the starting materials such as the respective metal oxide, carbonates or other salts are formed so as to give the desired nominal composition, and the mixtures are homogenised and subjected to a suitable heat treatment for obtaining the desired superconductor.

For the heat-treatment the starting mixture can be calcined at a temperature of about 700 to 900° C. for a period of about 2 to about 200 hours. The calcined mixture is then ground, converted into the desired shape and sintered at temperatures of about 800 to about 1100° C. in the semi- or fully-molten state. In order to obtain a high quality superconductor material it can be preferably to perform the process stages of firing, such as e.g. calcining, sintering and optionally post-annealing, which may be carried out in a single firing operation or in several, in possibly even repeated, sub stages. Examples of suitable BSCCO-based compounds and production methods thereof are found, for example, in EP-B-0 330 305 and EP-A-0 327 044, to which reference is expressly made here.

It is also known to produce the desired superconductor body by melt casting processes. For the melt casting process the powdery starting mixture is melted, the melt is poured into moulds and allowed to solidify slowly therein. The solidified shaped body is removed from the mould and subjected to a heat treatment, for example at temperatures of 700 to 900° C., in an oxygen containing atmosphere, to obtain the final superconductor body. The principle of the melt casting process are described for example in DE-A-38 30 092 to which reference is expressly made here. According to this, parts of solid materials such as rods, plates etcetera can be obtained.

An expansion of the forming possibilities is shaping via centrifugal casting of the ceramic melt. The principles of this technique are described in DE-A-40 19 368 to which also reference is expressly made here. This technique is in particular suitable for superconductors of tubular and annular shapes. In the centrifugal casting the molten starting mixture having a predetermined stoichiometry is allowed to run at temperatures from 900 to 1100° C. into a rotating casting zone, for example a casting zone rotating about its horizontal axis. The solidified shaped body is removed from the casting zone and subjected to heat treatment for about 4 to 150 hours at about 700 to 900° C. in an oxygen containing atmosphere.

It was further known, to admix high melting alkaline earth sulfates with the powdery starting mixture for the BSCCO-superconductors such as $SrSO_4$ and/or $BaSO_4$. The sulfate can amount up to 20% by weight or in case of $BaSO_4$, preferably, only up to about 10% by weight. Superconductors obtained by admixing such alkaline earth sulfates are disclosed for example in EP-A-0 524 442 and EP-A-0 573 798 to which reference is explicitly made.

Investigations by thermal analysis have revealed that the alkaline earth metal sulfates melt with the starting mixture, for example the oxides of Bismuth, Strontium, Calcium, Copper and, optionally, of lead, with the formation of eutectics. The melting point of Barium sulfate and Strontium sulfate are, specifically, considerably higher at 1580° C. and 1600° C., respectively.

Ceramographic investigations and photographs taken with the scanning electron microscope show that precipitations of Strontium sulfate and Barium sulfate are present in the high temperatures superconductors.

An insertion of the alkaline earth elements into the crystal structure of the unit cell of the superconductor phases, in particular, substitution of elements of the crystal structure of the unit cell by the alkaline earth elements has not been observed.

In U. P. Trociewitz et al. "The Influence of $BaO_2$ additions on microstructure and superconductor properties of $Bi_2Sr_2CaCu_2O_{8+\delta}$" Physica C000 (2001) pages 1 bis 13, $BaO_2$ is admixed to the starting mixture and treated by the ceramic route. In the obtained superconductor body the influence of the addition of $BaO_2$ on the development of texture in Bi-2212 is investigated. However, again, no substitution of elements of the unit cell by Ba is reported. Instead, it was observed that $BaO_2$ reacted under formation of new second phases.

It is reported that addition of $SrSO_4$ to the starting mixture and co-melting can reduce the risk of cracks of melt cast BSCCO 2212 (Elschner et al. "Influence of granularity on the critical current density in melt-cast processed $Bi_2Sr_2CaCu_2Ox$" in Supercond. Sci. Technol. 6 (1993) 413-120).

In Tomochi Kawai et al. "Effekt of Ba addition on the properties of Bi—Pb—Sr—Ca—Cu—O superconductors" Japanese Journal of Applied Physics, volume 27, Number 12, December 1988, pages L2296 to L2299, $BaCO_3$ is added to the powdery starting mixture of $Bi_2O_3$, PbO, $SrCO_3$, $CaCO_3$ and CuO and processed to a respective superconductor by sintering, that is by the ceramic route. It is stated, that the characteristic effect of the Ba addition seems to be the decomposition of the low Tc-phase of BSCCO superconductor by producing phases of $BaBiO_3$ and $BaCuO_2$ accompanied by high-Tc-phase formation. That is formation of second phases is observed rather than insertion or substitution of Ba into the crystal structure of the unit cell.

WO 97/49118 is directed to BSCCO material obtained by solid-state reaction wherein Bi may be partially substituted by a higher valance atom such as Pb, Hg, Re, Os etc. and Sr may be partially substituted by Ba or a larger lanthanide rare earth element. According to this publication due to the substitution the oxygen uptake of the Bi—O layer within the BSCCO structure is enhanced resulting in an increase of critical current density.

As set out above superconductors bodies with substantially round cross section such as cylindrical tubes, rods and annular bodies can be advantageously produced by the centrifugal melt casting process.

However, with the tubular superconductor components obtained by subjecting the prior art starting material to centrifugal melt casting irrespective of presence of $SrSO_4$ cracks are observed which interrupt current flow.

Further, the obtained melt-cast shaped superconductor components are liable to bending during annealing which is particularly a problem when processing thin bodies such as thin tubes and rods etcetera. Due to these adverse effects homogeneity of the critical current over the superconductor body can vary to a substantial extent and deteriorate the performance of superconductor body.

OBJECTS AND SUMMARY OF THE INVENTION

It was the object of the present invention to provide novel high temperature superconductors of the BSCCO family which can be obtained by melt casting technique, in particular by centrifugal melt-casting technique, being improved in view of cracks, being less liable to bending and, thus, having improved homogeneity of the critical current and, preferably, increased critical current.

Further it was the object of the present invention to provide an improved starting composition particularly suitable for the centrifugal melt casting process making possible to produce even thin superconductor bodies having excellent homogeneity of the critical current and critical current as well as the use of such starting composition in a centrifugal melt casting process.

The present invention relates to a high temperature superconductor material based on BiSrCaCuO wherein parts of Sr of the superconducting phase or superconducting phases is substituted by Ba.

Further the present invention relates to a starting composition for the high temperature superconductor material of BSCCO-type of the present invention which is a mixture of starting materials of the respective metal elements in a suitable mixing ratio to obtain the desired final composition.

Further the present invention relates to the use of such a starting composition comprising a mixture of starting compounds of the respective metal elements in an appropriate ratio to obtain the desired high temperature superconductor material of BSCCO-type wherein part of the Strontium of the superconducting phase(s) is substituted by Ba in a centrifugal melt casting process.

DETAILED DESCRIPTION

According to the present invention in the high temperature superconductor material of BSCCO-type part of the Sr within the superconducting phase is substituted by Ba. For obtaining the desired substitution a reactive starting material has to be chosen for the Ba-compound. Suitable reactive starting materials are e.g., the oxides, hydroxides, carbonates, hydrates and oxalates of barium, barium oxide being preferred. These compounds are by far more reactive compared to barium sulfate which is a stable compound. When adding barium sulfate to the starting composition of the desired high temperature superconductor material of BSCCO-type no Ba substitution of the Sr within the superconducting phases is observed which is considered to be due to the inertness of barium sulfate and the advantageous effects of the present invention can not be obtained.

Further, according to the present invention the barium compound is not added to a starting composition having already the starting compounds for the respective metal elements in an appropriate ratio for the formation of the desired final high temperature composition but replaces within the starting composition part of the appropriate proportion of the starting compound for Sr. That is, the starting composition comprises less Sr starting material as required for the formation of the desired final high temperature superconductor material of BSCCO-type and the difference between the proportion present and the proposition required is balanced by the Ba starting material.

For the present invention the preferred high temperature superconductor materials of the BSCCO-family are BSCCO-2223 and BSCCO-2212, wherein BSCCO-2212 is particularly preferred. Further, for the present invention particularly preferred are those BSCCO superconductors wherein part of Bi is replaced by Pb. The high temperature superconductor of the present system can be a single phase or multiphase material.

The high temperature superconductor material according to the present invention can be further developed in that it contains strontium sulfate in an amount of 0.1 to 30% by weight, preferably 3 to 10% by weight; and/or barium sulfate in an amount of 0.1 to 20% by weight, preferably 3 to 10% by weight. In this case an appropriate amount of the strontium sulfate and/or barium sulfate is added to the starting composition of the present invention wherein part of the proportion of the starting compound for Strontium required for the formation of the desired high temperature superconductor is replaced by the barium starting material.

The present invention is particularly suitable for obtaining high temperature superconductors of the BSCCO-family by a centrifugal melt casting process. In the centrifugal melt casting process the powdery starting composition is molten, the melt is then poured into a mould and is allowed to solidify on rotating the mould. After solidification the obtained shaped body is removed from the mould and subjected to suitable heat treatment to convert the material of the shaped body into the desired superconductor material.

Preferably this process can also be designed such that the melt is poured into a mould which is horizontally arranged and rotates about its longitudinal axis; further, for the heat treatment the obtained shaped bodies can be heated rapidly at 250 to 350° C./h up to 700° C. and above this temperature further heated slowly at 5° C. to 20° C./h; the heat treatment can be carried out in an atmosphere of air and nitrogen in the ratio by volume of 1:1, if desired, the heat treatment can be carried out in pure oxygen.

Appropriate starting compounds for both the respective metal elements of the high temperature superconductor material of BSCCO-type as well as Ba as substituent of part of the proportion of Sr are metal oxides, hydroxides, carbonates, hydrates, oxalates or other reactive precursors, the metal oxides being preferred. The starting compounds may be produced by wet or dry mixing, by coprecipitation of material from solution, or by any other method which results in intimate mixture of reactive particles.

According to the present invention in the desired BSCCO high temperature superconductor material the proportion of Sr which can be replaced by Ba, is preferably more than 5 at % and less than 50 at %.

According to a preferred embodiment of the present invention the high temperature superconductor material of BSCCO-family has a nominal composition of $Bi_{2.2-x}Sr_{2-y}Ba_yCa_{1-z}Cu_2O_{8+d}$ with $0 \leq x < 0.4$, $0.05 < y < 0.5$ and $0 < z < 0.2$. Further, Bi can be replaced by Pb in a proportion of up to 22 at %.

For example, for obtaining the high temperature superconductor material of the present invention an appropriate starting composition of the metal oxides in a suitable mixing ratio for obtaining the desired final high temperature superconductor material of the above cited formula is processed by a centrifugal melt casting technique, for example by a horizontal centrifugal melt casting process.

The obtained final superconducting shaped bodies have an improved performance in that they have significantly less cracks and are less liable to bending on annealing than corresponding non substituted superconductor materials, that is, materials having in principle the same composition as the superconductor material of the present invention, however, wherein the Sr content is equal to the Sr and Ba content of the substituted material of the present invention.

Further, the homogeneity of the critical current could be improved from variation of about 30% in the corresponding non substituted superconductor materials to a value of only 5% or even less. In addition, the critical current itself could be increased up to 20%. By applying the starting composition of the present invention to a centrifugal melt casting process it is possible to produce cylindrically shaped superconductor bodies such as rods tubes, having a diameter of 5 mm and a length of about 300 mm which do not bend during annealing.

The present invention is particularly useful for obtaining shaped bodies with substantially round cross-sections such as shaped bodies with tubular or annular shapes, e.g. rods, tubes etcetera.

The invention claimed is:

1. High temperature superconductor body of round cross section comprising:
   a material of BiSrCaCuO-family selected from BiSrCaCuO-2212 type material and BiSrCaCuO-2223 type material, wherein within superconducting phases more than 0.05, less than 0.50 atomic percent of Sr, is substituted by Ba, wherein the high temperature superconductor material is of melt-cast BiSrCaCuo-type and is a shaped body obtained by centrifugal melt casting process.

2. High temperature superconductor material according to claim 1, wherein the high temperature superconductor material has a nominal composition of $Bi_{2.2-x}Sr_{2-y}Ba_yCa_{1-z}Cu_2O_{8+d}$ with $0 \leq x < 0.4$, $0.05 < y < 0.5$ and $0 < z < 0.2$.

3. High temperature superconductor material according to claim 1, wherein the shaped body is selected from a rod and a tube.

4. High temperature superconductor material of BiSrCaCuO-family comprising:
   a material of melt-cast BiSrCaCuO-type selected from BiSrCaCuO-2212 type material and BiSrCaCuO-2223 type material, and is a shaped body of round cross section obtained by centrifugal melt casting process, wherein within superconducting phases more than 0.05, less than 0.50 atomic percent of Sr, is substituted by Ba, wherein said material is from a starting composition being a mixture of starting compounds of the metal elements of the high temperature superconductor material in an appropriate ratio where part of the starting compound for Sr, required for the respective non substituted high temperature superconductor material, is substituted by a starting compound for Ba.

5. High temperature superconductor material to claim 4, wherein the stoichiometrical ratio of the metal elements within the mixture satisfy the formula $Bi_{2.2-x}Sr_{2-y}Ba_yCa_{1-z}Cu_2O_{8+d}$ with $0 \leq x < 0.4$, $0.05 < y < 0.5$ and $0 < z < 0.2$.

6. High temperature superconductor material according to claim 4, wherein parts of the starting material for Bi is replaced by a starting material for Pb in a proportion corresponding to up to 22 of the atomic ratio.

7. High temperature superconductor comprising:
   a material of BiSrCaCuO-family selected from BiSrCaCuO-2212 type material, wherein a proportion of Bi may be substituted by Pb, and BiSrCaCuO-2223 type material, wherein within superconducting phases more than 0.05, less than 0.50 atomic percent of Sr, is substituted by Ba, wherein the high temperature superconductor material is of melt-cast BSCCO-type and is a shaped body obtained by centrifugal melt casting process forming a shaped body with round cross section.

8. High temperature superconductor material according to claim 7, wherein part of the Bi proportion is substituted by Pb.

\* \* \* \* \*